(12) United States Patent
Schneider et al.

(10) Patent No.: US 12,606,229 B2
(45) Date of Patent: Apr. 21, 2026

(54) STEERING WHEEL WITH ADAPTIVE-CAPACITIVE TOUCH RECOGNITION, AN ASSOCIATED ASSEMBLY AND MOTOR VEHICLE

(71) Applicant: Preh GmbH, Bad Neustadt a.d. Saale (DE)

(72) Inventors: Manfred Schneider, Oberthulba (DE); Lutz Doebrich, Neuhaus am Rennweg (DE)

(73) Assignee: Preh GmbH, Bad Neustadt a.d. Saale (DE)

( * ) Notice: Subject to any disclaimer, the term of this patent is extended or adjusted under 35 U.S.C. 154(b) by 276 days.

(21) Appl. No.: 17/659,788

(22) Filed: Apr. 19, 2022

(65) Prior Publication Data
US 2022/0340190 A1      Oct. 27, 2022

(30) Foreign Application Priority Data
Apr. 22, 2021    (DE) .......................... 102021110299.5

(51) Int. Cl.
*B62D 1/04*          (2006.01)
*B62D 1/10*          (2006.01)
(Continued)

(52) U.S. Cl.
CPC .............. *B62D 1/046* (2013.01); *B62D 1/10* (2013.01); *G06K 19/0723* (2013.01); *H03K 17/962* (2013.01)

(58) Field of Classification Search
CPC .......... B62D 1/046; B62D 1/065; B62D 1/10; G06K 19/0723; H03K 17/962
See application file for complete search history.

(56) References Cited

U.S. PATENT DOCUMENTS 5,722,686 A * 3/1998 Blackburn ........ B60R 21/01526
                                                        340/562
9,792,796 B1 * 10/2017 Lauka .................... G08B 21/02
                        (Continued)

FOREIGN PATENT DOCUMENTS

CN          104756169 A      7/2015
CN          112026905 A      12/2020
                        (Continued)

OTHER PUBLICATIONS

Chinese First Office Action No. 202210423148.0, dated Jun. 29, 2023.
                        (Continued)

*Primary Examiner* — Omer S Khan
(74) *Attorney, Agent, or Firm* — M&B IP Analysts, LLC

(57)      ABSTRACT

A steering wheel for a motor vehicle is presented. The steering wheel includes a steering wheel hub configured for the detachable attachment to a steering shaft of the motor vehicle; a steering wheel rim fixed to the steering wheel hub; at least one electrode, which is integrated into the steering wheel rim, for the capacitive detection of a touch on the steering wheel rim; an electrically conductive connection disposed outside the steering wheel to apply an electrical measuring potential for touch detection to the electrode, and to detect the touch on the steering wheel rim; a non-volatile data storage unit on or in the steering wheel, wherein the non-volatile data storage unit is in each case configured or developed to be read out by a reading unit disposed outside the steering wheel and connected to the electronic evaluation unit in a data-transmitting manner.

18 Claims, 1 Drawing Sheet

(51) Int. Cl.
     *G06K 19/07*      (2006.01)
     *H03K 17/96*      (2006.01)

(56)                    References Cited

U.S. PATENT DOCUMENTS

| | | | |
|---|---|---|---|
| 2015/0217795 A1* | 8/2015 | Barnes ...................... | F16D 1/06 |
| | | | 403/334 |
| 2017/0113696 A1* | 4/2017 | Oh ........................ | G06V 10/462 |
| 2018/0022374 A1* | 1/2018 | Fujikawa ............... | B62D 1/065 |
| | | | 219/204 |
| 2018/0087929 A1 | 3/2018 | Matsumura | |
| 2020/0001911 A1* | 1/2020 | Card ........................ | B32B 7/05 |
| 2020/0239060 A1* | 7/2020 | Hyoudou ............... | B62D 1/065 |

FOREIGN PATENT DOCUMENTS

| | | | |
|---|---|---|---|
| DE | 102010035940 | A1 | 3/2012 |
| DE | 112016001183 | | 11/2017 |
| DE | 102019203633 | A1 | 9/2020 |
| EP | 2723625 | B1 | 8/2017 |

OTHER PUBLICATIONS

The German Office Action for German Application No. 102021110299. 5, German Patent and Trademark Office, Munich, Germany, Dated: Jan. 10, 2021.

* cited by examiner

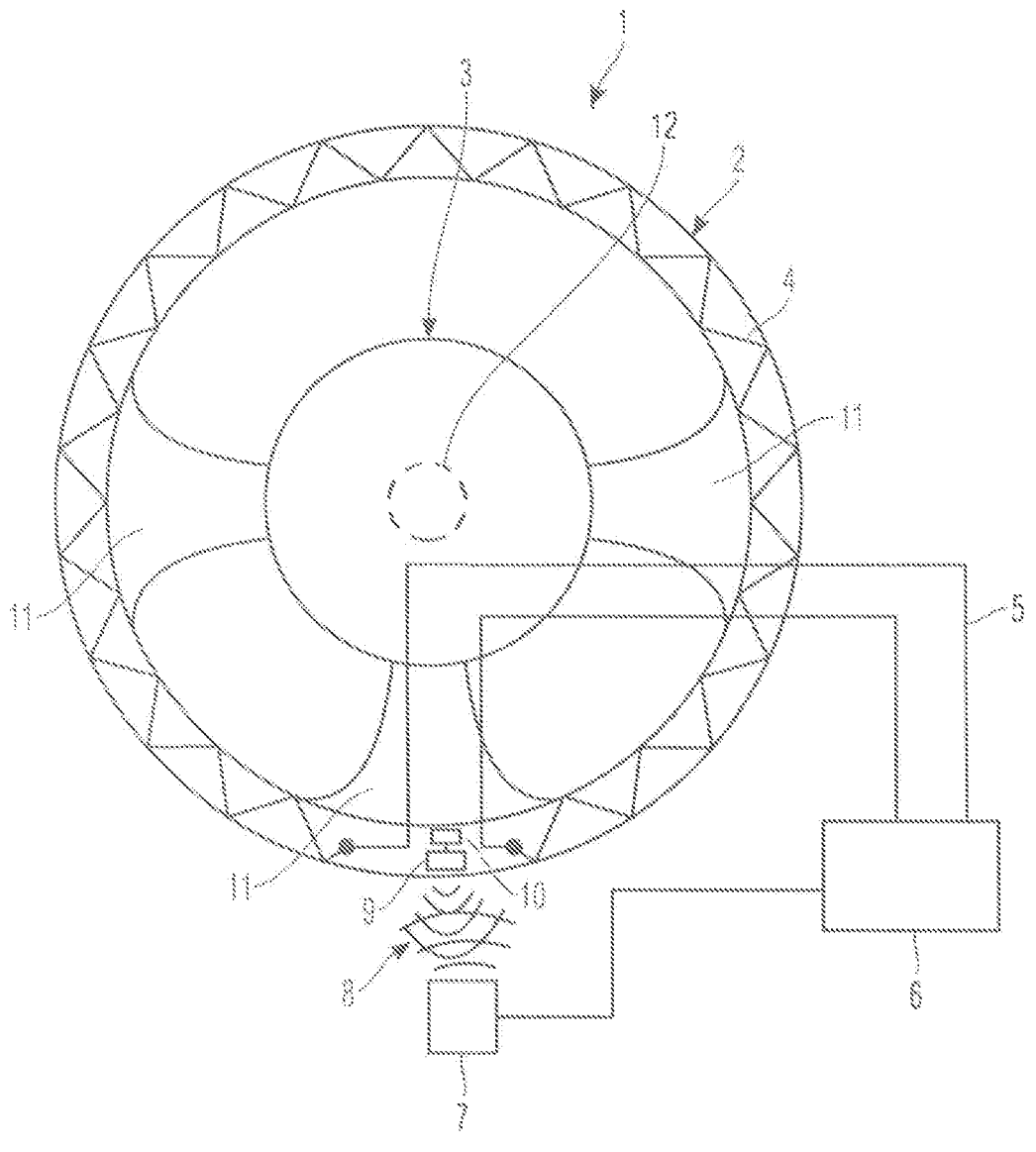

STEERING WHEEL WITH ADAPTIVE-CAPACITIVE TOUCH RECOGNITION, AN ASSOCIATED ASSEMBLY AND MOTOR VEHICLE

TECHNICAL FIELD

The present disclosure relates to a steering wheel with a capacitive touch recognition.

BACKGROUND

Steering wheels have evolved from simple input devices for performing manual steering inputs of a steering device of a motor vehicle. In addition to a steering control of a motor vehicle, it thus also serves for performing touch-based inputs including gesture-based inputs for controlling other components of the motor vehicle. Furthermore, it is configured for monitoring the steering control of the vehicle operator, e.g. while driving the vehicle, but particularly when switching into an autonomous traveling state of the motor vehicle and back. A manual grip recognition system for steering wheels is known from DE 10 2010 035 940 B4. A piezo-resistive layer, which reacts to the force exerted by the vehicle operator when gripping the steering wheel, is disposed around the circumference of the steering rim. If, for example, an anomaly such as a tense hand posture is detected by this system, the sensor signals may lead to the motor being turned off, or to a braking process being initiated. These devices, on which force acts, are disadvantageous in that they take up a comparatively large construction space and that thus, a detection covering the entire steering wheel rim can be realized only with difficulty. It was found that a capacitive recognition is advantageous in comparison, because it permits not only the touch recognition on the surface of the steering wheel rim, but also a recognition of proximity to the steering wheel rim before a surface contact has occurred. Due to a simple design of the electrodes used, touch recognition may take place in a spatially resolved and space-saving manner. The fact that an electrical steering wheel heating is provided in many steering wheels and the electrical equipment already provided may at least partially also be used for capacitive touch recognition is to be considered another advantage of a capacitive touch recognition integrated into the steering wheel. A disadvantage of capacitive touch recognition is the fact that, for reasons of space, the electronic evaluation unit is generally disposed outside the steering wheel, and that in the case of a replacement of a steering wheel, the touch recognition has to be retrained for the new steering wheel in order to ensure a reliable touch recognition, e.g. because of a changed permittivity of the steering wheel rim materials.

SUMMARY

Against this background, there was a need for a solution in which a steering wheel with capacitive touch recognition and an external evaluating unit can be replaced in a simplified manner, in particular without multiple calibration processes. This object is achieved with a steering wheel according to claim 1. An equally advantageous assembly and a corresponding motor vehicle are each the subject matter of the independent claims. Advantageous embodiments are in each case the subject matter of the dependent claims. It must be noted that the features cited individually in the claims can be combined with each other in any technologically meaningful manner and represent other embodiments of the present disclosure. The description, in particular in connection with the figures, additionally characterizes and specifies the present disclosure.

The present disclosure relates to a steering wheel for a motor vehicle. In this case, the term motor vehicle is also to include a software-aided simulation of a motor vehicle in which the steering wheel forms an input device for causing a virtual steering movement of a simulated motor vehicle. Generally, it is a part of a steering system of a motor vehicle with which the vehicle operator, by turning the steering wheel, causes a change of direction of the real or virtual motor vehicle, for example by one or several wheels of the steering wheel changing their steering position. The steering wheel according to the present disclosure comprises a steering wheel hub configured for the detachable attachment to a steering shaft of the motor vehicle. A screw connection, for example, is provided between the steering shaft and the steering wheel hub. The screw connection is covered by an impact absorber, for instance. Further, a steering wheel rim fixed to the steering wheel hub is provided according to the present disclosure. For example, the steering wheel rim is annular or, alternatively, formed as one or several ring segments. The steering wheel rim is fixed to the steering wheel hub by one or several steering wheel spokes, for example. According to the disclosed embodiments, at least one electrode, which is integrated into the steering wheel rim, for the capacitive detection of a touch on the steering wheel rim is provided. Moreover, according to the disclosed embodiments, an electrically conductive connection is provided between the electrode and an electronic evaluation unit disposed outside the steering wheel, in order to apply an electrical measuring potential for touch detection to the electrode via the electrically conductive connection, and in order to detect, based on an associated change in measuring capacitance and depending on at least one predetermined parameter, a touch on the steering wheel rim. The function of the capacitive touch detection is based, for instance, on the change of the electrical field in the vicinity in front of the electrode (active zone). For example, the electronic evaluation unit includes an RC oscillator circuit. The capacitance between the electrode and the electric ground potential is measured while the measuring potential is applied. A counter-electrode with an associated ground or counter-potential may also be provided instead of a ground potential. Due to a metallic or non-metallic substance approaching the electrode, particularly when the steering wheel rim is touched, the capacitance increases and thus affects the oscillation amplitude of the RC oscillator, This change causes a downstream trigger stage to "tilt" and change its initial state, whereby a touch is positively detected. Generally, the sensitivity of the electronic evaluation unit can be adjusted by selecting the switching distance. The switching distance of the capacitive touch detection varies with the permittivity constant and the conductivity of the approaching material, as well as with the effective surface of the approaching body compared with the electrode surface which, however, is the case only to a limited extent in the steering wheel situation. However, the switching distance is also dependent on the installation conditions, i.e. the materials of the steering wheel rim surrounding the electrode, i.e. on whether the former includes genuine leather, imitation leather, wood or the like. For example, the switching distance is determined by a parameter associated with the permittivity of the material of the steering wheel rim and/or a parameter associated with the geometry and the position of the electrode within the steering wheel rim.

According to the present disclosure, there is also provided a non-volatile data storage unit, which is disposed on or in the steering wheel and in which, in each case, at least one of the parameters, such as the parameter associated with the electric permittivity constant of the steering wheel rim material, for example, is stored. According to the present disclosure, the non-volatile data storage unit is read out by a reading unit, which is disposed outside the steering wheel and connected in a data-transmitting manner to the electronic evaluation unit, in order to transmit the at least one parameter to the electronic evaluation unit, so that the latter is able, for example in the evaluation steps subsequent to the read-out, to carry out the detection in an adjusted manner using the stored parameter. For example, the reading unit, the data storage unit and the electronic evaluation unit communicate via a data connection configured as a bus system, such as a CAN-BUS.

Preferably, at least the electrode and the data storage unit are disposed on a common substrate. Preferably, the substrate is a film or a fabric.

Preferably, the electrode is formed by a heating wire of a steering wheel heating. For example, the heating operation is carried out by applying a pulse-width modulated heating current to the heating wire, while touch detection takes place in each case during a dead time of this application.

For example, the reading unit and the non-volatile data storage unit are connected via a data line. A wireless read-out of the data storage unit is preferred, however, in which a transponder is provided, which is disposed on or in the steering wheel and which is electrically conductively connected to the data storage unit, and wherein the transponder communicates wirelessly with the reading unit. For example, the wireless communication between the transponder and the reading unit makes use of Radio Frequency Identification (RFID) technology in an active or passive configuration, Near Field Communication (NFC) technology, Bluetooth® technology or WiFi technology. Preferably, the transponder is also disposed on the above-mentioned substrate.

Preferably, both the transponder and the non-volatile data storage unit are integrated into the steering wheel rim.

The present disclosure moreover relates to an assembly comprised of a steering wheel in one of the configurations described above and an electronic evaluation unit disposed outside the steering wheel and a reading unit disposed outside the steering wheel. For example, the electronic evaluation unit and the reading unit are disposed behind a steering wheel trim or a dashboard panel or the center console of the motor vehicle.

Furthermore, the present disclosure relates to a motor vehicle with the above-described assembly, and to the use of the previously described assembly in a motor vehicle.

BRIEF DESCRIPTION OF THE DRAWINGS

The various disclosed embodiments explained in more detail with reference to the following Figure. The Figure is to be understood only as an example and merely represents a preferred embodiment. In the drawing:

FIG. 1 shows a schematic illustration of an embodiment of the assembly according to an embodiment.

DETAILED DESCRIPTION

FIG. 1 shows an embodiment of the assembly according to the embodiment. The assembly according to the embodiment comprises a steering wheel 1 and a reading unit 7 disposed outside the steering wheel 1 and an electronic evaluation unit 6 disposed outside the steering wheel 1. The reading unit 7 is connected in a data-transmitting manner to the electronic evaluation unit 6. A data line, which is not specified in any more detail, is provided in FIG. 1 for this purpose. However, this transmission may also be configured in a wireless manner.

The steering wheel 1 comprises a steering wheel hub 3 for the detachable attachment of the steering wheel 1 to a steering shaft 12 of a motor vehicle, which is not shown in any more detail. The steering wheel 1 further comprises an annular steering wheel rim 2, which is supported on the steering wheel hub 3 via several spokes 11. The surface of the steering wheel rim 2 serves as a grip surface for a motor vehicle operator, which is also referred to as a driver in short, to perform steering inputs. An electrode 4, which extends along the steering wheel rim 2 in the circumferential direction corresponding to the direction of rotation of the steering wheel 1, is disposed underneath the surface of the steering wheel rim 2, and thus integrated into the steering wheel rim 2. A measuring potential is applied to the electrode 4 by the electronic evaluation unit 6 via an electrically conductive connection 5. The electrically conductive connection 5 contains a slide contact provided in the region of the steering wheel hub 3, for example.

In this embodiment, the electrode 4 is formed by a heating wire of a steering wheel heating, which is not shown and which applies a pulse-width modulated heating current to the heating wire, while the electrode 4 is available for touch detection during the dead time of this heating current. Thus, a touch on the steering wheel rim 2 is detected by the electronic evaluation unit 6 based on an associated change in measuring capacitance and depending on a predetermined parameter. The function of the capacitive touch detection is based, for instance, on the change of the electrical field in the vicinity in front of the electrode 4, more specifically in the region of the surface of the steering wheel rim 2. For example, the electronic evaluation unit 6 includes an RC oscillator circuit. The capacitance between the electrode 4 and the electric ground potential is measured while the measuring potential is applied. As an alternative, a counter-electrode with an associated ground or counter-potential may also be provided instead of a ground potential. Due to a hand of the driver approaching the electrode 4, particularly when the steering wheel rim 2 is touched, the capacitance increases and thus affects the oscillation amplitude of the RC oscillator. This change causes a downstream trigger stage, which is associated with the electronic evaluation unit 6, to "tilt" and change its initial state, whereby a touch is positively detected, Generally, the sensitivity of the electronic evaluation unit 6 can be adjusted by selecting the switching distance, The switching distance of the capacitive touch detection varies with the permittivity constant and the conductivity of the approaching material, as well as with the effective surface of the approaching body compared with the electrode surface which, however, is the case only to a limited extent in the steering wheel situation. However, the switching distance is also dependent on the installation conditions, i.e. the materials of the steering wheel rim 2 surrounding the electrode 4, i.e. on whether the former includes genuine leather, imitation leather, wood or the like. For example, the switching distance is determined by a parameter associated with the permittivity of the material of the steering wheel rim 2 and/or a parameter associated with the geometry and the position of the electrode within the steering wheel rim 2.

Thus, according to the disclosed embodiments, there is also provided a non-volatile data storage unit 10, which is disposed on or in the steering wheel 1, here also in the steering wheel rim 2, and in which, in each case, at least one of the parameters, such as the parameter associated with the electric permittivity constant of the steering wheel rim material, for example, is stored. This non-volatile data storage unit 10 is read out by the reading unit 7, which is disposed outside the steering wheel 1 and connected in a data-transmitting manner to the electronic evaluation unit 6, in order to transmit the at least one parameter to the electronic evaluation unit 6, so that the latter is able, for example in the evaluation steps subsequent to the read-out, to carry out the detection in an adjusted manner using the stored and read-out parameter. In this embodiment, a wireless read-out of the non-volatile data storage unit 10 by means of a transponder 9 is provided, which is disposed on or in the steering wheel 1 and which is electrically conductively connected to the non-volatile data storage unit 10, and wherein the transponder 9 communicates wirelessly with the reading unit 7. For example, the wireless communication between the transponder 9 and the reading unit 7 makes use of Radio Frequency Identification (RFD) technology in an active or passive configuration, Near Field Communication (NFC) technology, Bluetooth® technology or WiFi technology. For example, the electrode 4, the non-volatile storage unit 10 and the transponder 9 are disposed on a common substrate, which is not shown in FIG. 1.

What is claimed is:

1. A steering wheel system for a motor vehicle, comprising:
   a steering wheel hub of a steering wheel, the steering wheel hub being configured as a detachable attachment to a steering shaft of the motor vehicle;
   a steering wheel rim fixed to the steering wheel hub;
   at least one electrode, which is integrated into the steering wheel rim, wherein the at least one electrode is configured for a capacitive detection of a touch on the steering wheel rim;
   an electrically conductive connection between the at least one electrode and an electronic evaluation unit comprised of electronic circuitry, disposed outside the steering wheel, to apply an electrical measuring potential for touch detection to the at least one electrode via the electrically conductive connection, and to detect, based on an associated change in measuring capacitance, the touch on the steering wheel rim, depending on at least one predetermined parameter, wherein the at least one predetermined parameter is at least one of the group consisting of a permittivity of a material of the steering wheel rim, a geometry of the electrode within the steering wheel rim, and a position of the electrode within the steering wheel rim, and wherein a sensitivity of the electronic evaluation unit is adjusted based on a switching distance which is a function of the at least one predetermined parameter;
   a non-volatile memory integrated with the steering wheel and in which the at least one predetermined parameter is stored; and
   a reading circuit, which is disposed outside the steering wheel, is connected in a data-transmitting manner to the electronic evaluation unit, and which is adapted to read out the at least the at least one predetermined parameter from the non-volatile memory and to transmit the at least one predetermined parameter to the electronic evaluation unit.

2. The steering wheel system according to claim 1, wherein the at least one electrode and the non-volatile memory are disposed on a common substrate.

3. The steering wheel system according to claim 2, wherein the common substrate is any one of: a film and a fabric.

4. The steering wheel system according to claim 1, wherein the at least one electrode is formed by a heating wire of a steering wheel heating.

5. The steering wheel system according to claim 1, wherein the non-volatile memory is read out by the reading circuit wirelessly via a transponder disposed on the steering wheel.

6. The steering wheel system according to claim 5, wherein the transponder, the at least one electrode and the non-volatile memory are disposed on a common substrate.

7. The steering wheel system according to claim 5, wherein the transponder and the non-volatile memory are disposed in the steering wheel rim.

8. The steering wheel of claim 1, wherein:
   the motor vehicle is adapted to switch into an autonomous traveling state and back;
   the at least one electrode is formed by a heating wire of a steering wheel heater; and
   the reading circuit, the non-volatile memory, and the electronic evaluation unit communicate via a data connection that is configured as a bus system.

9. The steering wheel of claim 1, wherein the electronic evaluation unit and the reading circuit are disposed behind at least one of a steering wheel trim, a dashboard panel, and a center console of the motor vehicle.

10. The steering wheel of claim 1, wherein the reading circuit, the non-volatile memory, and the electronic evaluation unit communicate via a data connection configured as a bus system.

11. An assembly, comprising:
   a steering wheel hub of a steering wheel, the steering wheel hub being configured as a detachable attachment to a steering shaft of a motor vehicle;
   a steering wheel rim fixed to the steering wheel hub;
   at least one electrode, which is integrated into the steering wheel rim, wherein the at least one electrode is configured for a capacitive detection of a touch on the steering wheel rim;
   an electrically conductive connection between the at least one electrode and an electronic evaluation unit comprised of electronic circuitry, disposed outside the steering wheel, to apply an electrical measuring potential for touch detection to the at least one electrode via the electrically conductive connection, and to detect, based on an associated change in measuring capacitance, the touch on the steering wheel rim, depending on at least one predetermined parameter, wherein the at least one predetermined parameter is at least one of the group consisting of a permittivity of a material of the steering wheel rim, a geometry of the electrode within the steering wheel rim, and a position of the electrode within the steering wheel rim, and wherein a sensitivity of the electronic evaluation unit is adjusted based on a switching distance which is a function of the at least one predetermined parameter;
   a non-volatile memory integrated with the steering wheel and in which the at least one predetermined parameter is stored; and
   a reading circuit, which is disposed outside the steering wheel, is connected in a data-transmitting manner to the electronic evaluation unit, and which is adapted to read out at least the at least one predetermined parameter from the non-volatile memory and to transmit the at least one predetermined parameter to the electronic evaluation unit.

12. The assembly of claim 11, wherein:

the motor vehicle is adapted to switch into an autonomous traveling state and back;

the at least one electrode is formed by a heating wire of a steering wheel heater; and the reading circuit, the non-volatile memory, and the electronic evaluation unit communicate via a data connection that is configured as a bus system.

13. The assembly of claim 11, wherein the electronic evaluation unit and the reading circuit are disposed behind at least one of a steering wheel trim, a dashboard panel, and a center console of the motor vehicle.

14. The assembly of claim 11, wherein the reading circuit, the non-volatile memory, and the electronic evaluation unit communicate via a data connection configured as a bus system.

15. A motor vehicle, comprising:

an assembly, wherein the assembly further comprises:

a steering wheel hub of a steering wheel, the steering wheel hub being configured as a detachable attachment to a steering shaft of the motor vehicle;

a steering wheel rim fixed to the steering wheel hub;

at least one electrode, which is integrated into the steering wheel rim, wherein the at least one electrode is configured for a capacitive detection of a touch on the steering wheel rim;

an electrically conductive connection between the at least one electrode and an electronic evaluation unit comprised of electronic circuitry, disposed outside the steering wheel, to apply an electrical measuring potential for touch detection to the at least one electrode via the electrically conductive connection, and to detect, based on an associated change in measuring capacitance, the touch on the steering wheel rim, depending on at least one predetermined parameter, wherein the at least one predetermined parameter is at least one of the group consisting of a permittivity of a material of the steering wheel rim, a geometry of the electrode within the steering wheel rim, and a position of the electrode within the steering wheel rim, and wherein a sensitivity of the electronic evaluation unit is adjusted based on a switching distance which is a function of the at least one predetermined parameter;

a non-volatile memory integrated with the steering wheel and in which the at least one predetermined parameter is stored; and a reading circuit, which is disposed outside the steering wheel, is connected in a data-transmitting manner to the electronic evaluation unit, and which is adapted to read out at least the at least one predetermined parameter from the non-volatile memory and to transmit the at least one predetermined parameter to the electronic evaluation unit.

16. The motor vehicle of claim 15, wherein:

the motor vehicle is adapted to switch into an autonomous traveling state and back;

the at least one electrode is formed by a heating wire of a steering wheel heater; and the reading circuit, the non-volatile memory, and the electronic evaluation unit communicate via a data connection that is configured as a bus system.

17. The motor vehicle of claim 15, wherein the electronic evaluation unit and the reading circuit are disposed behind at least one of a steering wheel trim, a dashboard panel, and a center console of the motor vehicle.

18. The motor vehicle of claim 15, wherein the reading circuit, the non-volatile memory, and the electronic evaluation unit communicate via a data connection configured as a bus system.

* * * * *